United States Patent [19]
Chiu

[11] Patent Number: 6,010,255
[45] Date of Patent: Jan. 4, 2000

[54] ACOUSTIC WAVE ENHANCED DEVELOPER

[75] Inventor: Wei-Kay Chiu, Hsin-Chu, Taiwan

[73] Assignee: Taiwan Semiconductor Manufacturing Company, Hsin-Chu, Taiwan

[21] Appl. No.: 09/216,793

[22] Filed: Dec. 21, 1998

Related U.S. Application Data

[62] Division of application No. 08/772,608, Dec. 23, 1996, Pat. No. 5,876,875.

[51] Int. Cl.$^7$ .................................................. G03D 5/00
[52] U.S. Cl. ................................ 396/611; 396/633; 134/1; 134/902
[58] Field of Search .................................. 396/611, 633; 134/1, 902, 1.3; 430/3; 118/52

[56] References Cited

U.S. PATENT DOCUMENTS

| | | | |
|---|---|---|---|
| 4,612,267 | 9/1986 | Heitmann et al. | 430/3 |
| 4,633,804 | 1/1987 | Arii | 118/52 |
| 5,368,054 | 11/1994 | Koretsky et al. | 134/902 |
| 5,395,803 | 3/1995 | Adams | 437/229 |
| 5,454,871 | 10/1995 | Liaw et al. | 118/300 |
| 5,650,251 | 7/1997 | Ishiwata et al. | 430/3 |
| 5,858,475 | 1/1999 | Chiu | 27/560 |
| 5,868,866 | 2/1999 | Mackawa et al. | 134/902 |

*Primary Examiner*—Alan A. Mathews
*Attorney, Agent, or Firm*—George O. Saile; Stephen B. Ackerman

[57] ABSTRACT

A method and an apparatus are disclosed for enhancing the solution diffusibility of a developing liquid in a semiconductor wafer developing unit through the agitation of the liquid by acoustic power. Two embodiments are described using sonic and ultrasonic waves. In the first embodiment, a sonic wave couples into the developing liquid, agitating it and thereby enhancing its solution diffusibility. In the second embodiment, an ultrasonic wave couples into the semiconductor wafer, causing the photoresist pattern to vibrate, again enhancing the solution diffusibility of the developing liquid.

7 Claims, 3 Drawing Sheets

ACOUSTIC WAVE ENHANCED DEVELOPER

RELATED PATENT APPLICATION

This is a division of patent application Ser. No. 08/772,608, filing date Dec. 23, 1996, Acoustic Wave Enhanced Developer, assigned to the same assignee as the present invention, now U.S Pat. No. 5,876,875, Acoustic Wave Enhanced Spin Coating Method, title filing date Dec. 23, 1996, Ser. No. 08/772,609, now U.S. Pat. No. 5,858,475.

BACKGROUND OF THE INVENTION

1. Field of the Invention

This invention relates to a process for enhancing the solution diffusibility of a developing liquid in a semiconductor wafer developing unit.

2. Description of the Prior Art

The current practice is to develop a photoresist on the surface of a substrate while the substrate is rotating on a wafer chuck. This mechanical rotation is essentially static, as far as the developer is concerned, and developing speed is limited by solution diffusibility. This is because the developer becomes stagnant with photoresist and fresh developing liquid cannot diffuse toward the photoresist. As a result, development ceases.

While integration density is steadily increasing, the art of improving methods of developing photoresist has lagged behind with respect to increased solution diffusibility, developing speed, or feature uniformity.

A variety of methods have been described in the patent literature dealing with irradiation of photoresist, depositing of photoresist, or applying of spin-on-glass. But there appear to be no prior art teachings regarding methods of enhancing developers, be they organic solvents for negative resists or alkaline solutions for positive resists. U.S. Pat. No. 4,612,267 (Heitmann et al.) discusses the ultrasonic irradiation of a resist layer. U.S. Pat. No. 5,395,803 (Adams) discloses a method of depositing a material, such as a photoresist, upon a substrate. U.S. Pat. No. 5,454,871 (Liaw et al.) describes an apparatus for applying spin-on-glass material to a wafer under controlled humidity conditions.

SUMMARY OF THE INVENTION

It is an object of the present invention to provide a method and an apparatus for enhancing the solution diffusibility of a developing liquid in a wafer developing unit.

These objects have been achieved in two ways. Firstly, by providing a sonic generator and coupling its sonic wave into the developing liquid, thereby agitating the developing liquid with attending enhancement of the solution diffusibility. Secondly, by providing an ultrasonic generator and coupling its ultrasonic wave into the semiconductor wafer. This causes the photoresist pattern to vibrate, again enhancing the solution diffusibility of the developing liquid.

In either embodiment improved solution diffusibility results in improved feature uniformity and reduced processing time.

DESCRIPTION OF THE PREFERRED EMBODIMENT

Our invention improves the developer solution diffusibility by allowing fresh developing liquid to replace stagnated, photoresist laden developing liquid at the microscopic level. This is achieved by applying acoustic power during the developing process.

The method and apparatus of providing acoustic power to a semiconductor wafer developing unit can take two forms, where either one or both can be used. In the first embodiment a developing liquid on a semiconductor wafer is exposed to a sonic wave. In the second embodiment an ultrasonic wave is coupled into the semiconductor wafer. In either method, the sonic or ultrasonic power causes agitation of the developing liquid and enhances its solution diffusibility.

Figure 1:
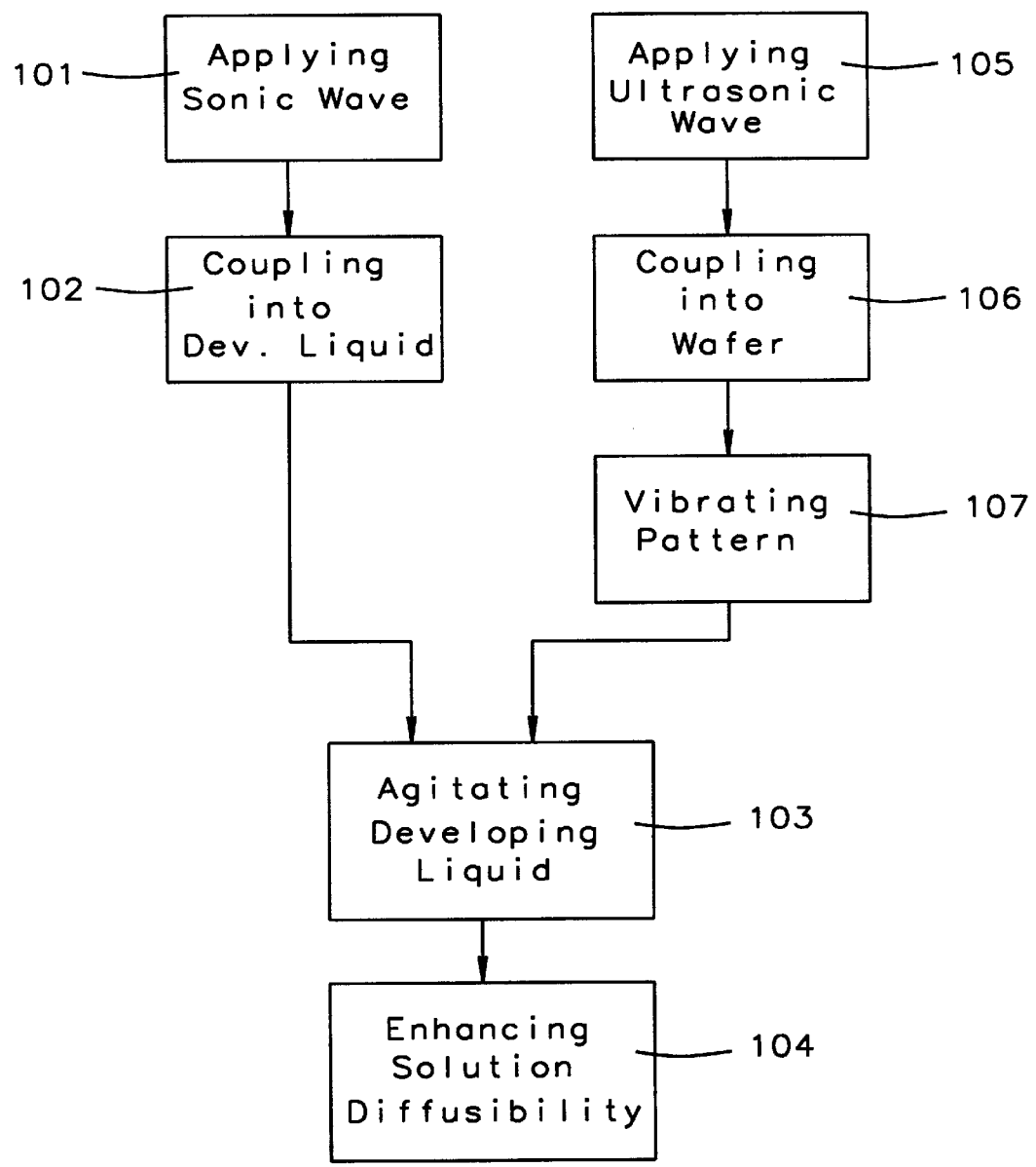
FIG. 1 is a block diagram illustrating the method of the present invention.

Referring now to FIG. 1, we show a block diagram of the method of the present invention. Block 101 shows the application of sonic power to the developing liquid, where the developing liquid is distributed over the photoresist on a substrate. The sonic wave is provided by a sonic generator located above the semiconductor wafer. The sonic wave couples into the developing liquid, Block 102, and agitates it (Block 103). Agitation enhances the solution diffusibility of the developing liquid, as depicted in Block 104.

Still referring to FIG. 1, Block 105 shows applying an ultrasonic wave through the use of ail ultrasonic wave generator, which couples the ultrasonic wave into the semiconductor wafer, Block 106, and causes the pattern on the substrate to vibrate laterally (Block 107). This vibration once more causes agitation, Block 103, of the developing liquid and enhances its solution diffusibility, Block 104.

Two embodiments are proposed for an apparatus to provide acoustic power to a developing liquid and a semiconductor wafer.

Figure 2:
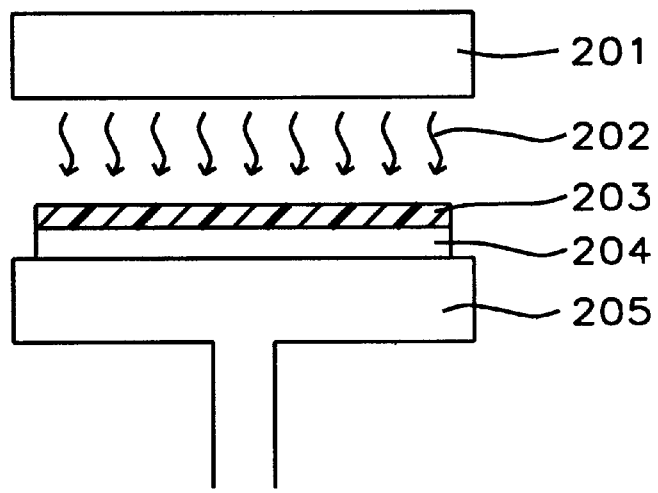
FIG. 2 is a side view of the sonic generator, wafer and chuck assembly, embodying the present invention.

Referring now to FIG. 2, the first enbodiment provides for a sonic generator 201, generating a sonic wave 202, placed above a semiconductor wafer 204 with a pattern on it, and a developing liquid 203 distributed on top of the pattern. A rotating chuck 205 supports the semiconductor wafer. The sonic wave 202 induces agitation in the developing liquid 203 and enhances its solution diffusibility. The agitation produces standing waves, which show up as puddling on top of the developing liquid.

Figure 3:
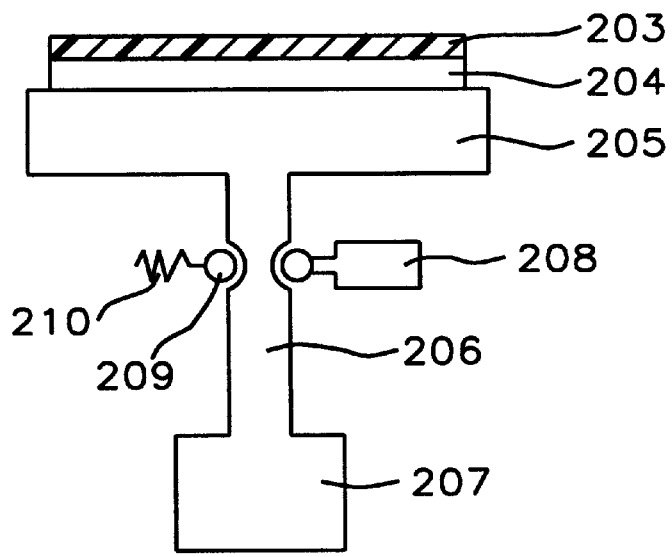
FIG. 3 is a side view of the ultrasonic generator, wafer and chuck assembly, depicting one embodiment of the present invention.

Referring now to FIG. 3, one version of the second embodiment provides for an ultrasonic generator attached to the chuck 205 through appropriate means (not shown), so that the ultrasonic power (wave) can couple into the chuck. In another version of the second embodiment an alternate attachment point for the ultrasonic generator 208 is spindle 206. In the latter case, the ultrasonic wave is coupled into the spindle via a ball bearing 209 and a resilient mount 210 (this illustration is by way of example only and is not intended to limit the scope of the invention.) A spin motor 207 then rotates the spindle as required. The ultrasonic wave is then transmitted to the semiconductor wafer 204 and causes the pattern to vibrate laterally. This vibration again agitates the developing liquid 203 and enhances its solution diffusibility.

Figure 4A:
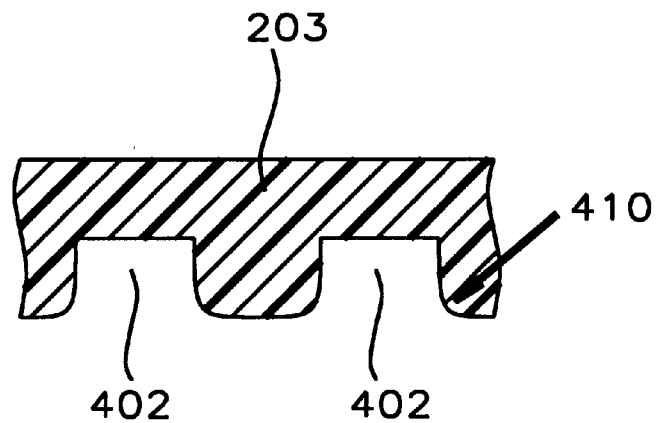
FIG. 4A is a detail of FIG. 3, showing a view of the developing liquid and pattern under static conditions.
Figure 4B:
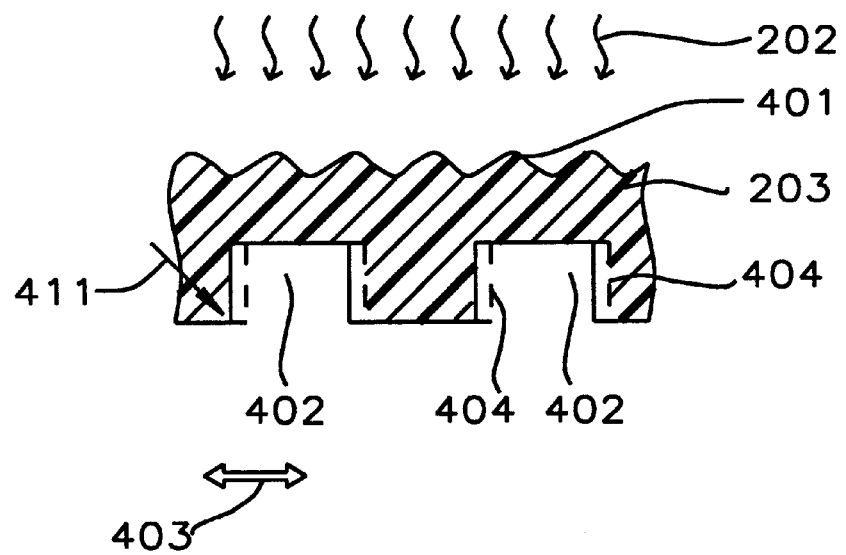
FIG. 4B is a detail of FIG. 3, showing a view of the developing liquid and pattern, illustrating the effects of applying acoustic power as embodied in the present invention.

FIG. 4A is an enlargement of developing liquid 203 and semiconductor wafer 204 of FIG. 3, showing in detail developing liquid 203 and pattern 402 on the substrate when no acoustic wave is applied. As indicated by arrow 410, photoresist is not removed from the corners, because the developer is saturated with photoresist and not getting exchanged. FIG. 4B is the same view, except that it shows sonic wave 202 causing puddling 401 of the developing liquid 203 and ultrasonic wave 403 producing lateral movement 404 in pattern 402. Here, photoresist is removed from the corners, as indicated by arrow 411, because of agitation and because stagnant developing liquid is replaced with fresh liquid.

In prior art, development slowed down in areas where the line pattern was dense, because more developer was consumed and the stagnant developing liquid was not flushed away and replenished. As a result, the critical dimensions were wider than in those areas where there were few or widely spaced lines and where the developing liquid was not stagnant and development continued.

By using the sonic and/or ultrasonic methods and apparatus, the agitation causes stagnant developing liquid to be flushed away and to be replaced by fresh liquid. Development is, therefore, similar in dense and less dense areas and the difference in critical dimensions is smaller than in prior art, resulting in improved printed feature uniformity. The increased agitation also reduces wafer processing time, resulting in increased economy of manufacture.

While the invention has been particularly shown and described with reference to the preferred embodiments thereof, it will be understood by those skilled in the art that various changes in form and details may be made without departing from the spirit and scope of the invention.

What is claimed is:

1. An apparatus for providing acoustical power to a semiconductor wafer developing unit, comprising:

a sonic generator placed above said semiconductor wafer;

a pattern present on said semiconductor wafer;

said developing liquid distributed on top of said pattern;

a chuck supporting said semiconductor wafer;

an ultrasonic wave generator attached to said chuck;

a spindle attached to said chuck, and a spin motor causing said spindle to rotate.

2. The apparatus of claim 1, wherein said sonic generator, placed above said semiconductor wafer, induces standing waves into said developing liquid.

3. The apparatus of claim 1, wherein said ultrasonic wave generator couples into a ball bearing assembly.

4. The apparatus of claim 3, wherein said ball bearing assembly is attached to said spindle.

5. The apparatus of claim 4, wherein said ball bearing assembly is supported by resilient means.

6. The apparatus of claim 1, wherein said ultrasonic wave generator induces ultrasonic waves into said pattern present on said semiconductor wafer.

7. The apparatus of claim 6, wherein said pattern vibrates laterally.

* * * * *